United States Patent
Yeh et al.

(10) Patent No.: US 10,613,128 B2
(45) Date of Patent: *Apr. 7, 2020

(54) TESTING DEVICE AND TESTING METHOD

(71) Applicant: Powertech Technology Inc., Hsinchu County (TW)

(72) Inventors: Chih-Hui Yeh, Hsinchu County (TW); Ming-Jyun Yu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 132 days.

This patent is subject to a terminal disclaimer.

(21) Appl. No.: 15/975,789

(22) Filed: May 10, 2018

(65) Prior Publication Data
US 2018/0259558 A1    Sep. 13, 2018

Related U.S. Application Data

(63) Continuation-in-part of application No. 15/298,246, filed on Oct. 20, 2016, now Pat. No. 9,998,350.

(30) Foreign Application Priority Data

Oct. 22, 2015  (TW) .............................. 104134638 A

(51) Int. Cl.
*G01R 23/02* (2006.01)
*G01R 31/28* (2006.01)
(Continued)

(52) U.S. Cl.
CPC ......... *G01R 23/02* (2013.01); *G01R 31/2879* (2013.01); *G01R 31/31908* (2013.01);
(Continued)

(58) Field of Classification Search
CPC ....... H04B 7/0413; H04L 43/50; G01R 23/02; G01R 31/2844; G01R 31/2879;
(Continued)

(56) References Cited

U.S. PATENT DOCUMENTS

| 3,909,799 A | 9/1975 | Recks et al. |
| 4,575,792 A | 3/1986 | Keeley |

(Continued)

FOREIGN PATENT DOCUMENTS

| CN | 1975440 | 6/2007 |
| TW | 200617411 | 6/2006 |

*Primary Examiner* — Kashif Siddiqui
(74) *Attorney, Agent, or Firm* — patenttm.us; James H. Walters

(57) ABSTRACT

A testing device includes a transfer interface, a tester, a first socket group and a second socket group. The first socket group includes a plurality of tested devices coupled in series and the second socket group includes a plurality of tested devices coupled in series. The tester is electrically connected to the socket group via the transfer interface. The transfer interface is configured to merge a first testing signal with a second testing signal to generate a double frequency testing signal. The double-frequency testing signal and a plurality of control signals are provided to the tested devices in the first socket group and the second socket group to perform the testing procedure on the tested devices of a same tested device pair simultaneously, and performing the testing procedure on the tested device pairs sequentially.

20 Claims, 4 Drawing Sheets

(51) Int. Cl.
    *G01R 31/319* (2006.01)
    *G11C 29/14* (2006.01)
    *G11C 29/50* (2006.01)
    *G11C 29/12* (2006.01)
    *G11C 29/56* (2006.01)

(52) U.S. Cl.
    CPC ........ *G11C 29/12015* (2013.01); *G11C 29/14* (2013.01); *G11C 29/50012* (2013.01); *G11C 29/56012* (2013.01); *G01R 31/2844* (2013.01)

(58) Field of Classification Search
    CPC ........ G01R 31/31908; G11C 29/12015; G11C 29/14; G11C 29/50012; G11C 29/56012
    See application file for complete search history.

(56) References Cited

U.S. PATENT DOCUMENTS

| | | |
|---|---|---|
| 6,353,908 B1 | 3/2002 | Heinrich |
| 6,654,834 B1 | 11/2003 | Robertson et al. |
| 6,801,985 B1 | 10/2004 | Comisky et al. |
| 7,080,300 B1 | 7/2006 | Herron et al. |
| 7,395,454 B1 | 7/2008 | Wohlgemuth et al. |
| 7,689,897 B2 | 3/2010 | Priel et al. |
| 9,998,350 B2 * | 6/2018 | Yeh ..................... H04B 7/0413 |
| 2003/0085726 A1 | 5/2003 | Rutten |
| 2009/0129183 A1 * | 5/2009 | Priel .............. G01R 31/318552 365/201 |

* cited by examiner

TESTING DEVICE AND TESTING METHOD

CROSS-REFERENCE TO RELATED APPLICATION

This application is a continuation-in-part application of and claims the priority benefit of U.S. application Ser. No. 15/298,246, filed on Oct. 20, 2016, now allowed, which claims the priority benefit of Taiwan application serial no. 104134638, filed on Oct. 22, 2015. The entirety of each of the above-mentioned patent applications is hereby incorporated by reference herein and made a part of this specification.

BACKGROUND OF THE INVENTION

Field of the Invention

The present invention generally relates to a testing device and a testing method. More particularly, the present invention relates to a testing device and a testing method that may improves the testing efficiency and throughput of a testing procedure.

Description of Related Art

After IC fabrication, wafer acceptance test (WAT), chip probing (CP), and package assembly, an appropriate tester should be adopted to perform final tests (FT) on the electrical functions of memory devices. Generally speaking, the highest testing frequency provided by a tester is fixed. However, the operation frequency of memory devices continuously increases, which makes existing testers not be able to test high-frequency memory devices in the next generation. A conventional method of frequency multiplication is proposed by changing a circuit board interface, or so-called Device Specific Adapter (DSA). As such, two input/output (I/O) terminals of a tester are connected to one pin of the circuit board interface to achieve frequency multiplication purpose. However, the testing efficiency and throughput may be greatly reduced. Moreover, testing accuracy is greatly reduced and potential errors are found when a single high-frequency testing signal is compared to a testing signal that has gone through frequency multiplication.

Therefore, there is a need for a testing device and a testing method high testing frequency and high throughput, thereby improving the testing efficiency of the testing procedure.

SUMMARY OF THE INVENTION

Accordingly, the present invention is directed to a testing device and a testing method that may improve the testing frequency and testing throughput of a testing procedure.

The present invention provides a testing device including a tester, a transfer interface, a first socket group and a second socket group. The tester has a first input/output (I/O) terminal and a second I/O terminal, wherein the first I/O terminal is configured to supply a first testing signal and the second I/O terminal is configured to supply a second testing signal. The transfer interface is coupled to the tester and configured to merge the first testing signal and the second testing signal received from the tester to generate a double-frequency testing signal. The first socket group has a plurality of first tested devices coupled in series and is coupled to the transfer interface to receive the double-frequency testing signal. The second socket group has a plurality of second tested devices coupled in series and is coupled to the transfer interface to receive the double-frequency testing signal.

In an embodiment of the present invention, the first tested devices respectively correspond to the second tested devices, and the first tested devices and corresponding second tested devices respectively form a plurality of tested device pairs, where the first tested device and the second tested device of a same tested device pair receive the double-frequency testing signal simultaneously.

The present invention provides a testing method which includes the steps of receiving a first testing signal from a first I/O terminal and receiving a second testing signal from a second I/O terminal; merging the first testing signal and the second testing signal to generate a double-frequency testing signal; grouping a plurality of first tested devices which are connected in series to a first socket group and grouping a plurality of second tested devices which are connected in series to a second socket group; and performing a first testing procedure, wherein the double-frequency testing signal and the plurality of control signals are supplied to the tested devices through the first socket group and the second socket group.

Based on the above-mentioned description, by merging the testing signals to the double-frequency testing signal and uses the double-frequency testing signal to perform the testing procedure, the tester may test the testing devices at high frequency. In addition, by serial coupling the tested device in the first and second socket groups, and forming the tested device pairs, the tester is able to perform parallel testing to a plurality of tested devices with high frequency, thereby improving efficiency and testing throughput of the testing procedure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

With reference to the attached drawings, the present invention is described by means of the embodiment(s) below. Therein, the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios may be selectively designed and disposed and the detail component layouts may be more complicated.

Figure 1:
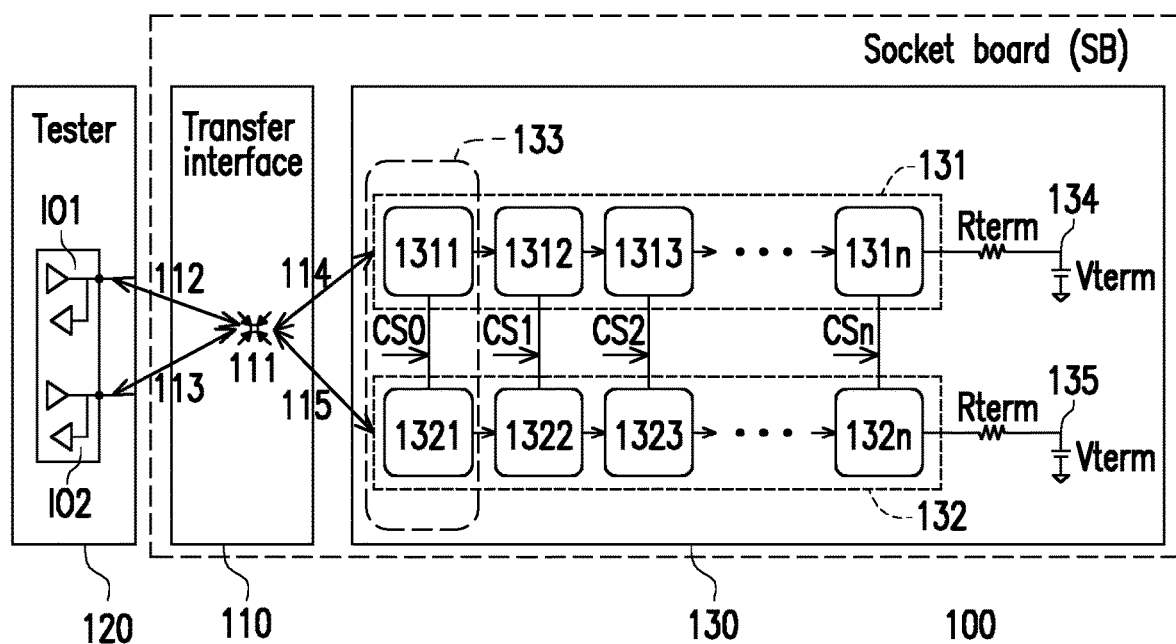
FIG. 1 is a block diagram of a testing device according to an embodiment of the present invention.

Referring to FIG. 1, a testing device 100 includes a tester 120 and a socket board (SB) which includes a transfer interface 110 and a socket circuit 130. The transfer interface 110 will be included in a Hi-Fix Socket board and is connected between the tester 120 and the socket circuit 130.

The tester 120 includes a first I/O terminal IO1 and a second I/O terminal IO2. The first I/O terminal IO1 is configured to supply a first testing signal to the transfer interface 110; and the second I/O terminal IO2 is configured to supply a second testing signal to the transfer interface 110. A frequency of the first testing signal and a frequency of the second testing signal may be the same or maybe different. In an embodiment, the first testing signal and the second testing signal have the same frequency but have timing differences when transmitted by the tester 120. It should be noted that the present application is not limited to any specific number of the I/O terminals of the tester 120.

The transfer interface 110 includes a signal intersection 111, a first bus 112, a second bus 113, a third bus 114 and a fourth bus 115. The first I/O terminal IO1 is coupled to the signal intersection 111 through the first bus 112 so that the first testing signal is transmitted from the first I/O terminal IO1 to the signal intersection 111 through the first bus 112. The second I/O terminal IO2 is coupled to the signal intersection 111 through the second bus 113, so that the second testing signal is transmitted from the second I/O terminal IO2 to the signal intersection 111 through the second bus 113. After the transfer interface 110 receives the first testing signal and the second testing signal, the signal intersection 111 merges the first testing signal and the second testing signal to generate a double-frequency testing signal. The double-frequency testing signal may be twice the frequency of the first testing signal or twice the frequency of the second testing signal.

A transmission path of the first bus 112 and a transmission path of the second bus 113 may be substantially the same as shown in FIG. 1, such that the signal intersection 111 is able to receive the first testing signal and the second testing signal without any timing delay and avoid merging errors due to transmitting timing delay.

The socket circuit 130 may further include a first socket group 131 and a second socket group 132 as shown in FIG. 1. The first socket group 131 and the second socket groups 132 are configured to accommodate a plurality of tested devices to be tested. Each of the sockets of the first socket group 131 and the second socket group 132 may be configured to accommodate one of the tested devices, and each of the tested devices includes one or more chips (not shown) assembled therein.

The first socket group 131 may include a plurality of sockets for accommodating a plurality of tested devices 1311 to 131$n$ which are coupled in series. The second socket group 132 may include a plurality of sockets for respectively accommodating a plurality of tested devices 1321 to 132$n$ which are coupled in series. The tested devices 1311 to 131$n$ of the first socket group 131 respectively correspond to the tested devices 1321 to 132$n$ of the second socket group 132. The tested devices 1311 to 131$n$ of the first socket group 131 and the corresponding tested devices 1321 to 132$n$ of the second socket group 132 respectively form a plurality of tested device pairs 133. The tested device of the first socket group 131 and the tested device of the second socket group 132 of a same tested device pair receive the double-frequency testing signal simultaneously so as to perform the testing procedure simultaneously.

In an embodiment of the present application, the tester 120 supplies a plurality of control signals CS0 to CS$n$ to the first socket group 131 and the second socket group 132. The same control signal is supplied to the tested devices in the same pairs to enable the testing procedure of the tested devices. As shown in FIG. 1, the tested device 1311 and the tested device 1321 of the tested device pair 133 receives the same control signal CS0, so that the tested devices 1311 and 1321 may perform the testing procedure simultaneously. As deduced by analogy, the tested devices 131$n$ and 132$n$ belong to the same tested device pair and receive the same control signal CS$n$ so as to enable the tested device 131$n$ and 132$n$ to perform the testing procedure simultaneously, where n is an integer larger than 1.

The double-frequency testing signal and the control signals CS0 to CS$n$ are further transmitted to a plurality of tested devices of the first socket group 131 and the second socket group 132 to perform the testing procedure. The tested devices may output a plurality of feedback signals. Herein, the tested devices 1311 to 131$n$ of the first socket group 131 transmit at least one first feedback signal to the signal intersection 111. The tested devices 1321 to 132$n$ of the second socket group 132 transmit at least one second feedback signal to the signal intersection 111. The transfer interface 110 duplicates either the first feedback signal or the second feedback signal to generate a plurality of identical feedback signals. A part of the identical feedback signals is transmitted from the signal intersection 111 to the first I/O terminal IO1 through the first bus 112 and another part of the identical feedback signal is transmitted from the signal intersection 111 to the second I/O terminal IO2 through the second bus 113. The tester 120 receives the identical feedback signals from the tested devices at different I/O terminals IO1 and IO2 and correlate the first testing signals with the second testing signals to complete the testing of the tested devices.

As shown in FIG. 1, a transmission path of the third bus 114 and a transmission path of the fourth bus 115 are substantially the same, such that the signal intersection 111 may be able to transmit the combinative double-frequency testing signal of first testing signal and the second testing signal without any timing delay. Since the transmission paths of the first bus 112 and the second bus 113 are substantially the same, the I/O terminal IO1 and the I/O terminal IO2 can simultaneously receive the identical feedback signals transmitted by the signal intersection 111 to avoid the effect of the timing delay on the testing results. In FIG. 1, the first socket group 131 is coupled to the first termination line 134 and the second socket group 132 is coupled to the second termination line 135. Each of the termination lines 134 and 135 has a resistance value Rterm and a voltage value Vterm. The voltage value Vterm may be varied according to a type of the testing devices to be tested. For example, Vterm may be set to be a half of a supply voltage to the output buffers of a memory chip VDDQ (½*VDDQ) when the tested devices are Double Data Rate (DDR) memory DDR1, DDR 2, DDR 3 or lower-power DDR (LPDDR) memory LPDDR 1, LPDDR 2, LPDDR. Vterm may be set to be equal to VDDQ when the tested devices are DDR4; and the Vterm may be set to be equal to 0V when the tested devices are LPDDR4.

To perform the testing procedure in the tested device pair 133, the tested devices 1311 and 1321 in the tested device pair 133 are supplied with the control signal CS0 from the tester 120 and the double-frequency testing signal from the transfer interface through the bus 114 and 115. The control signal CS0 enables the tested device 1311 and 1321 in the same tested device pair 133 to perform the testing procedure with the double-frequency testing signal simultaneously.

The testing procedure is performed on the tested device pair sequentially. In other words, after the testing procedure is completed on the tested device pair including the tested devices 1311 and 1321, the testing procedure is performed on the next tested device pair including the tested device 1312 and 1322. In this way, the testing procedure is performed sequentially on the tested device pairs.

Figure 2:
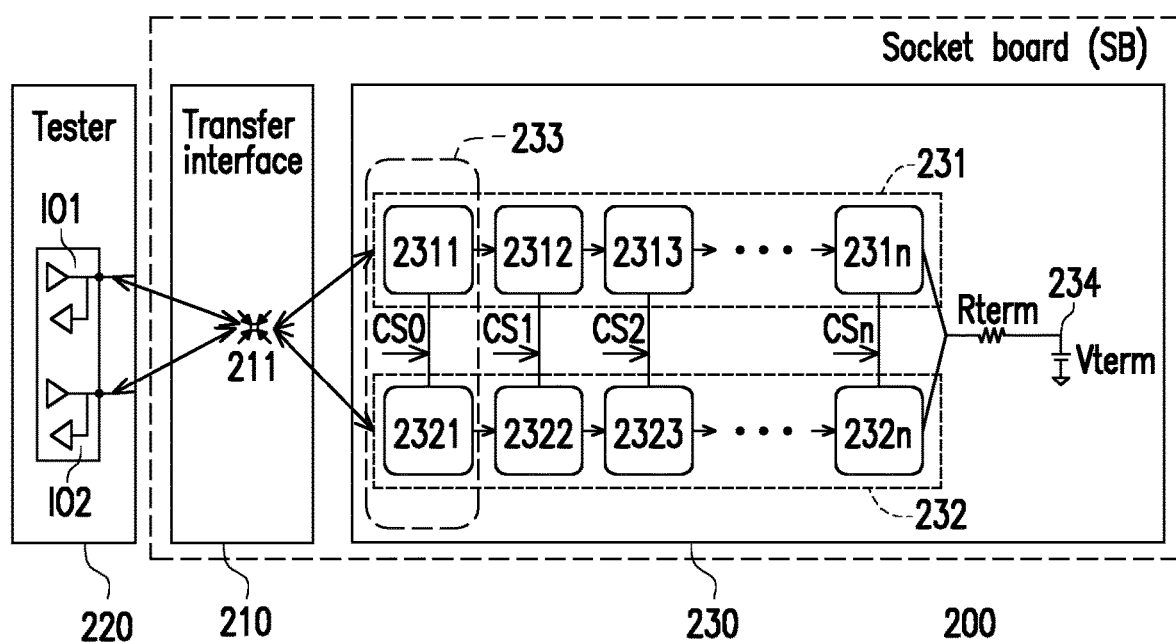
FIG. 2 is a block diagram of a testing device according to another embodiment of the present invention.

Referring to FIG. 2, a testing device 200 includes a tester 220 and a socket board (SB) which include a transfer interface 210 and a socket circuit 230. The tester 220 and the transfer interface 210 are similar to the tester 120 and the transfer interface 110 in FIG. 1, thus the detailed description of these elements is omitted herein. The socket circuit 230 includes a first socket group 231 and the second socket groups 232, where the first socket group 231 includes a plurality of tested devices 2311 to 231n coupled in series; and the second socket group 232 includes a plurality of tested devices 2321 to 232n coupled in series. The tested devices 2311 to 231n of the first socket group 231 and the tested devices 2321 to 232n of the second socket group 232 form a plurality of tested device pairs 233, wherein the testing procedure is performed on the tested devices of the same tested device pair simultaneously and is performed on the tested device pairs sequentially. The first socket group 231 and the second socket groups 232 are coupled to the same termination line 234.

Referring to FIG. 3A to FIG. 3D, timing diagrams of the first testing signal, the second testing signal, and the double-frequency testing signal during a testing procedure (WRITE procedure) on the tested device according to different embodiments are illustrated. The first testing signal the second testing signal may include a plurality of pulses in different levels (e.g., high-level pulses and low-level pulses). The frequency of the double-frequency testing signal may be twice the frequency of the first testing signal or a twice of the frequency of the second testing signal.

Referring to FIG. 1 and FIG. 3A to FIG. 3D, a testing method utilizing the testing device 100 is described as follows. The tester 120 provides the first testing signal and the second testing signal to the transfer interface 110 through the buses 112 and 113, respectively. The signal intersection 111 of the transfer interface 110 merges the first and second testing signals to generate the double-frequency testing signal and provides the double-frequency testing signal to the first socket group 131 and the second socket group 132. Meanwhile, the tester 120 provides the control signals CS0 to CSn to the tested devices of the first socket group 131 and the second socket group 132. The tested devices in the same tested device pair receive the double-frequency testing signal simultaneously; and the tested devices in the same tested device pair receive the same control signal simultaneously. As such, the tested devices of the same tested device pair perform the testing procedure simultaneously. The control signals CS0 to CSn are configured to perform the testing procedure on the tested device pairs sequentially. In an example, the control signals CS0 to CSn are delayed from each other so that the control signals CS0 to CSn may sequentially enable the tested device pairs to perform the testing procedure. However, the present invention should not be limited thereto, and the control signals CS0 to CSn may be used in different ways to enable the tested device pairs sequentially.

Figure 3A:
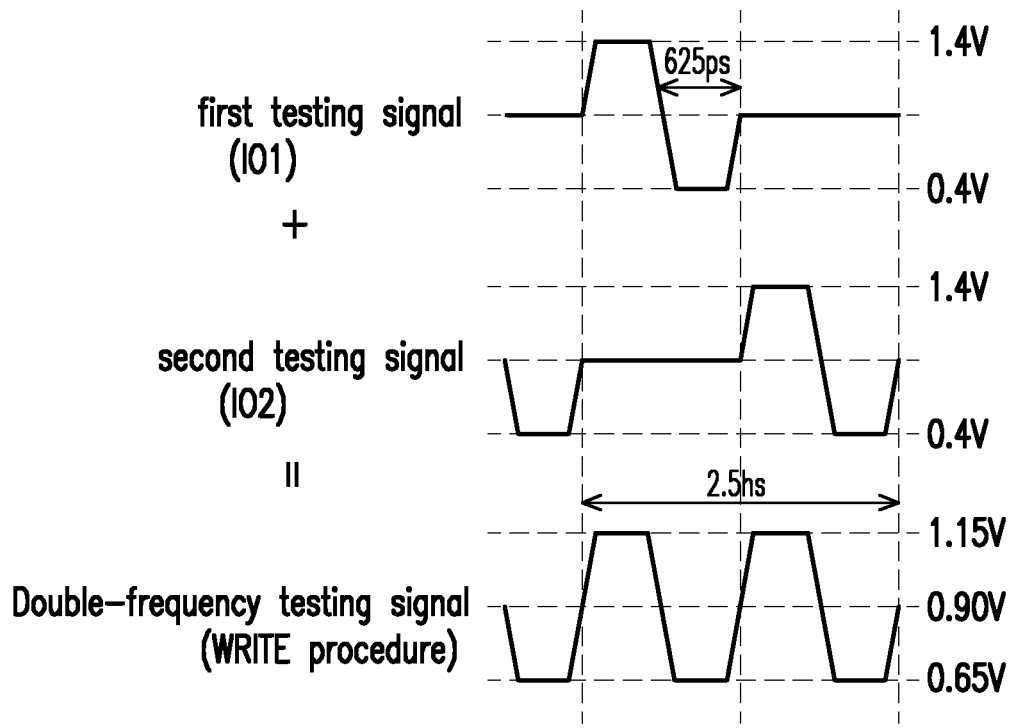
FIG. 3A to 3D are timing diagrams examples of a first testing signal, a second signal and a double-frequency testing signal during a first testing procedure according to embodiments of the present invention.

In the FIG. 3A, each of the first testing signal may include a high-level pulse followed by a low-level pulse. However, the present invention is not limited the first testing signal and the second testing signal to any specific waveform or magnitude levels. The first testing signal and the second testing signal are provided according to the testing requirements.

Figure 3B:
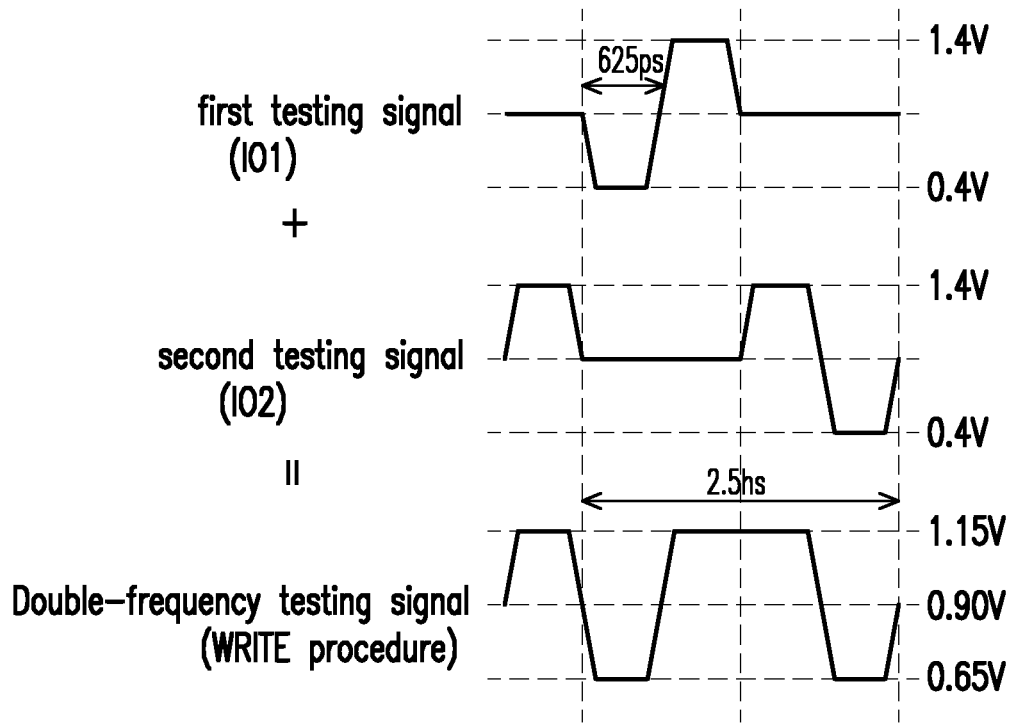
Figure 3C:
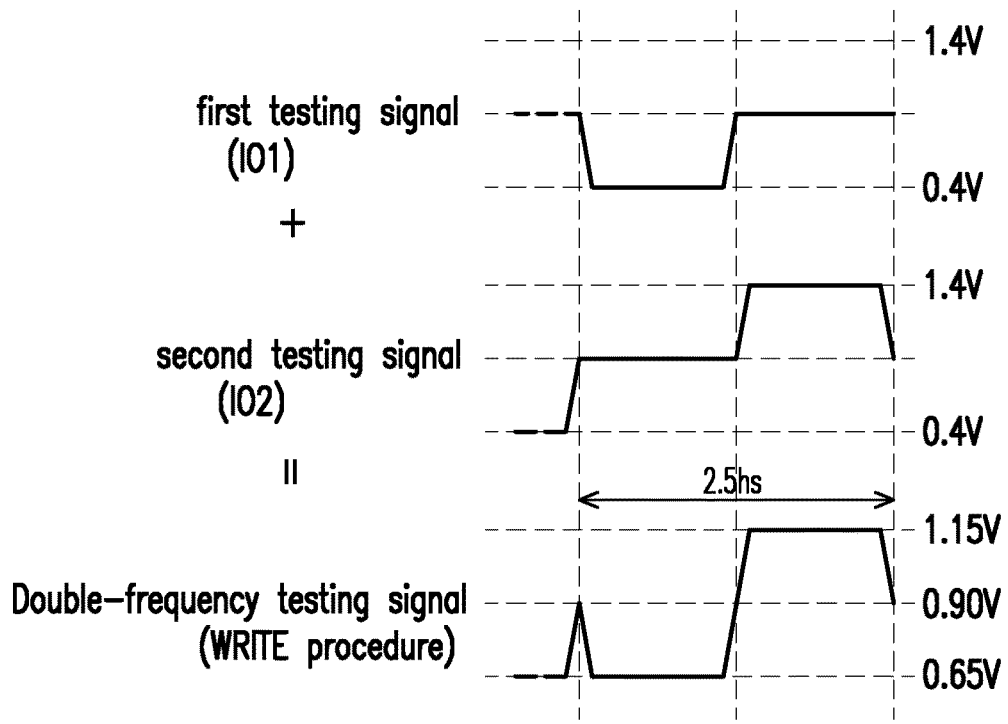
Figure 3D:
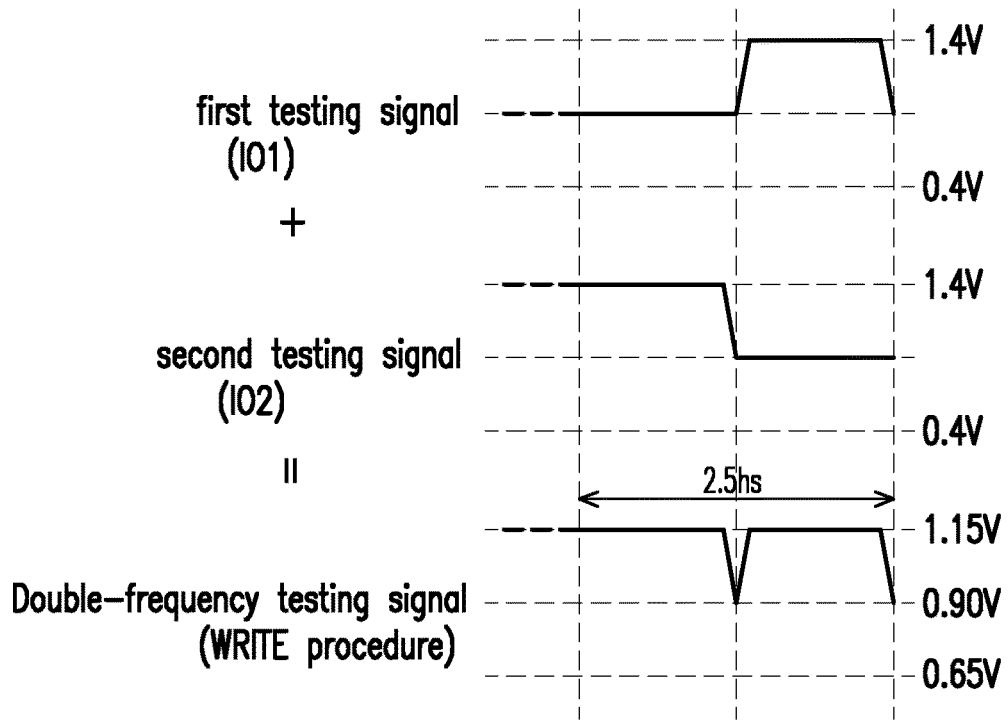

For example, in FIG. 3B, the first testing signal may include a low-level pulse followed by a high-level pulse and the second testing signal may include a high-level pulse followed by a low-level pulse. Alternatively, in FIG. 3C, the first testing signal includes a pulse formed by two low-level pulses then tri-state and the second testing signal may include a tri-state then followed by a pulse formed by another two high-level pulses. In FIG. 3D, the first testing signal may include tri-state then a pulse formed by two high-level pulses and the second testing signal may include a pulse formed by two high-level pulses then tri-state. The double-frequency testing signal are generated according to the first and second testing signals, wherein the frequency of the double-frequency testing signal may be twice the frequency of the first testing signal or a twice of the frequency of the second testing signal.

Figure 3E:
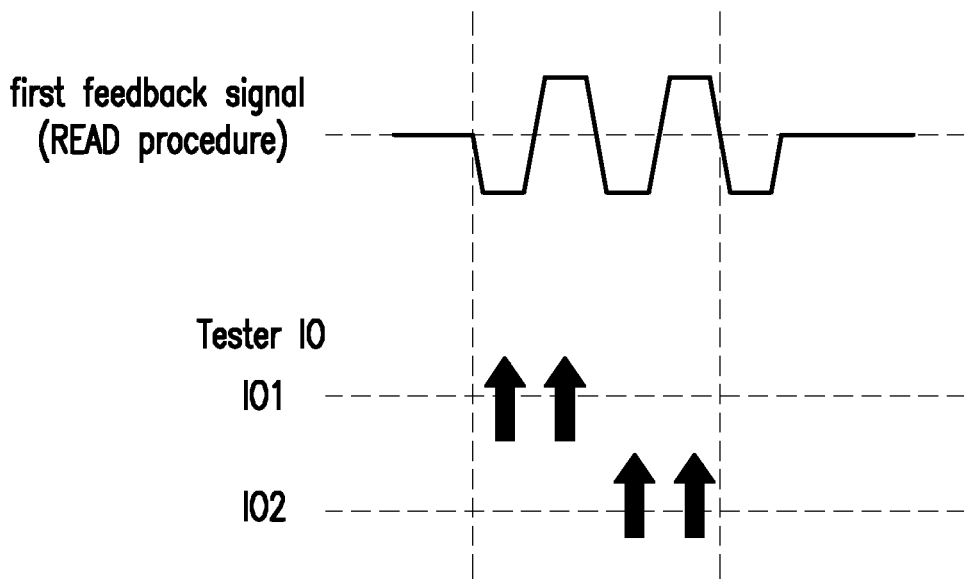
FIG. 3E is a timing diagram of identical feedback signals detected at different I/O terminals during a second procedure according to an embodiment of the present invention.

FIG. 3E illustrates a timing diagram of the identical feedback signals read from a tested device detected at different I/O terminals during the READ procedure. Herein, the detected timing is illustrated as the arrows pointing upward in FIG. 3E. It should be noted that the waveform of the identical feedback signals shown in FIG. 3E are merely for illustration purpose, different waveforms of the identical feedback signals falls within the scope of the present application.

Referring to FIG. 1 and FIG. 3E, a first feedback signal transmitted by the one of the tested devices arranged in the first socket group 131 is transmitted to the signal intersection 111 through the third bus 114. The transfer interface 110 duplicates and shares the first feedback signal to generate a plurality of identical first feedback signals. One of the identical first feedback signals is transmitted to the I/O terminal IO1 through the signal intersection 111 and the first bus 112, and another one of the identical first feedback signals is transmitted to the I/O terminal IO2 through the signal intersection 111 and the second bus 113. The tester 120 receives the plurality of the identical first feedback signals from different I/O terminals IO1 and IO2 and correlates the identical first feedback signals with the first testing signals and the second testing signals to complete the READ procedure of testing the one of the tested devices arranged in the first socket group 131. During the READ procedure to the one of the tested devices of the first socket group 131, either in synchronous or asynchronous, a second feedback signal transmitted by another tested device arranged in the second socket group 132 is transmitted to the signal intersection 111 through the fourth bus 115. The transfer interface 110 duplicates the second feedback signal to generate a plurality of identical second feedback signals, wherein one of the identical second feedback signals is transmitted to the I/O terminal IO1 through the signal intersection 111 and the first bus 112, and another one of the identical second feedback signals is transmitted to the I/O terminal IO2 through the signal intersection 111 and the second bus 113. The tester 120 may receive the plurality of the identical second feedback signals from different I/O terminals, and correlates the identical second feedback signals with the first testing signal and the second testing signal to complete the READ procedure of testing the another tested device arranged in the second socket group 132.

Figure 4:
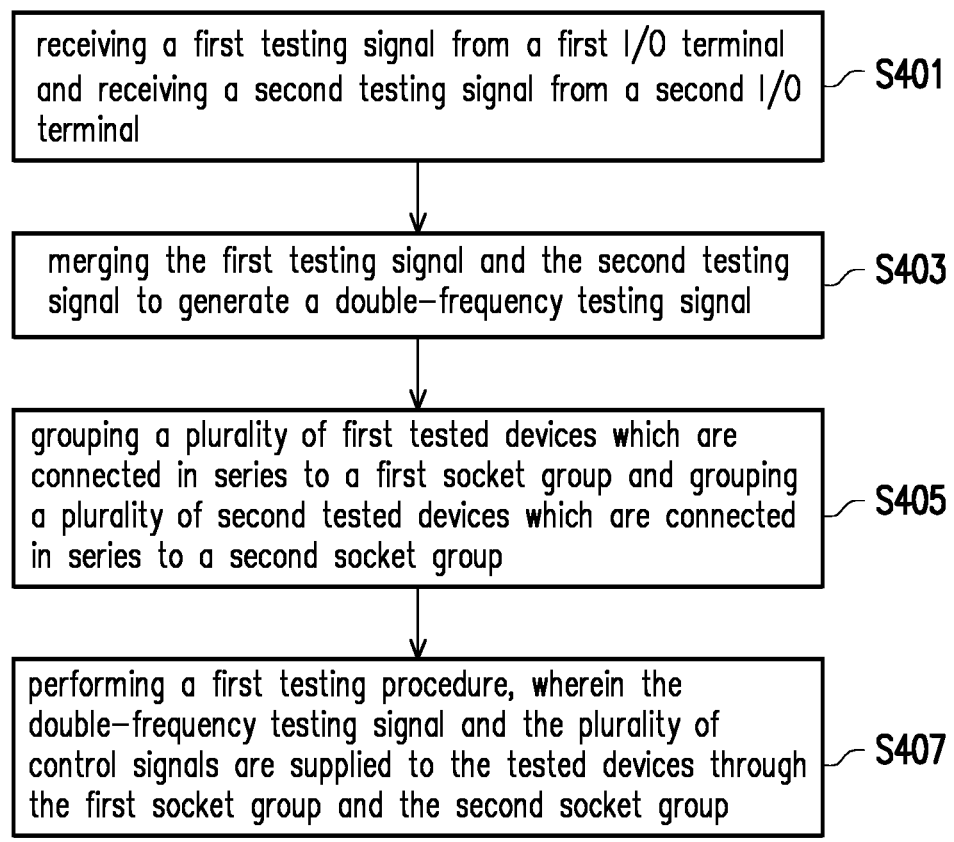
FIG. 4 is a block diagram of a testing method according to an embodiment of the present application.

FIG. 4 illustrates a testing method according to an embodiment of the present application. In step S401, a first testing signal is received from a first I/O terminal and a second testing signal is received from a second I/O terminal. In step S403, the first testing signal and the second testing signal are merged to generate a double-frequency testing signal. In step S405, a plurality of tested devices is grouped into a first socket group and a second socket group, where the first socket group includes a plurality of first tested devices which are connected in series and the second socket group includes a plurality of second tested devices which are connected in series. In step S407, a first testing procedure is performed, wherein the double-frequency testing signal and the plurality of control signals are supplied to the tested devices through the first socket group and the second socket group.

In the embodiments of the present invention, the testing signals are merged by the signal intersection of the transfer interface to generate the double-frequency testing signals. Then, the generated double-frequency testing signals and the corresponding feedback signal are duplicated and shared for high-frequency writing and reading. Therefore, the tester is capable of simultaneously perform the testing procedure in high frequency. Also, there are a first socket group which includes a plurality of tested devices coupled in series and a second socket group which includes a plurality of tested devices coupled in series. The tested devices in the first socket group and the corresponding tested devices in the second socket group form a plurality of tested device pair, where each of the tested device pair receives the double-frequency testing signal simultaneously and receives the same control signal. In this way, the tested device of the same tested device pair performs the testing procedure simultaneously. In addition, by performing the testing procedure on the tested devices of the same tested device pair simultaneously, and performing the testing procedure on the tested device pairs sequentially, the testing efficiency and the testing throughput of the testing procedure are improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A testing device, comprising:
  a tester, having a first input/output (I/O) terminal and a second I/O terminal, wherein the first I/O terminal is configured to supply a first testing signal and the second I/O terminal is configured to supply a second testing signal;
  a transfer interface, coupled to the tester and configured to merge the first testing signal and the second testing signal received from the tester to generate a double-frequency testing signal;
  a first socket group, having a plurality of first tested devices coupled in series, coupled to the transfer interface to receive the double-frequency testing signal;
  a second socket group, having a plurality of second tested devices coupled in series, coupled to the transfer interface to receive the double-frequency testing signal.

2. The testing device of claim 1, wherein the first tested devices respectively correspond to the second tested devices, and the first tested devices and corresponding second tested devices respectively form a plurality of tested device pairs, where the first tested device and the second tested device of a same tested device pair receive the double-frequency testing signal simultaneously.

3. The testing device of claim 2, wherein the tester supplies a plurality of control signals to the plurality of tested device pairs, wherein the first tested device and the second tested device in the same tested device pair receive a same control signal.

4. The testing device of claim 3, wherein the plurality of socket pairs is supplied with the double-frequency testing signal sequentially to perform a testing procedure sequentially.

5. The testing device of claim 4, wherein the control signals are respectively enabled sequentially according to the testing procedure.

6. The testing device of claim 1, wherein the double-frequency testing signal is twice a frequency of the first testing signal or twice a frequency of the second testing signal.

7. The testing device of claim 1, wherein a frequency of the first testing signal and a frequency of the second testing signal is substantially the same.

8. The testing device of claim 1, wherein the first socket group is electrically coupled to a first termination line, the second socket group is electrically coupled to a second termination line, and the first termination line is different from the second termination line.

9. The testing device of claim 1, wherein the first socket group and the second socket group are electrically coupled to a same termination line.

10. The testing device of claim 1, wherein the transfer interface comprises:
  a first bus, coupled to the first I/O terminal to receive a first testing signal;
  a second bus, coupled to the second I/O terminal to receive a second testing signal;
  a third bus, coupled to the first socket group to supply the double-frequency testing signal to the first socket group;
  a fourth bus, coupled to the second socket group to supply the double-frequency testing signal to the second socket group; and
  a signal intersection, configured to receive the first testing signal though the first bus, a second testing signal through the second bus, merge the first testing signal and the second to generate the double-frequency testing signal, and supply the double-frequency testing signal to the first socket group and the second socket group via the third bus and the fourth bus respectively.

11. A testing method adapted to a testing device, comprising:
  receiving a first testing signal from a first I/O terminal and receiving a second testing signal from a second I/O terminal;
  merging the first testing signal and the second testing signal to generate a double-frequency testing signal;
  grouping a plurality of first tested devices which are connected in series to a first socket group and grouping a plurality of second tested devices which are connected in series to a second socket group; and
  performing a first testing procedure, wherein the double-frequency testing signal and the plurality of control signals are supplied to the tested devices through the first socket group and the second socket group.

12. The testing method of claim 11, further comprising:
  performing a second testing procedure, wherein a first feedback signal is output through the first socket group and is duplicated to generate a plurality of identical first feedback signals, one of the identical first feedback signal is transmitted to the first I/O terminal and another one of the identical first feedback signal is transmitted to the second I/O terminal;

wherein a second feedback signal is output through the second socket group and is duplicated to generate a plurality of identical second feedback signals, one of the identical second feedback signal is transmitted to the first I/O terminal and another one of the identical second feedback signal is transmitted to the second I/O terminal.

13. The testing device of claim 11, wherein the first tested devices respectively correspond to the second tested devices, and the first tested devices and corresponding second tested devices respectively form a plurality of tested device pairs, where the first tested device and the second tested device of a same tested device pair receive the double-frequency testing signal simultaneously.

14. The testing device of claim 13, further comprising:

supplying a plurality of control signals to the plurality of tested device pairs, wherein the first tested device and the second tested device in the same tested device pair receive a same control signal.

15. The testing device of claim 14, wherein the plurality of socket pairs is supplied with the double-frequency testing signal sequentially to perform a testing procedure sequentially.

16. The testing device of claim 11, wherein the double-frequency testing signal is twice a frequency of the first testing signal or twice a frequency of the second testing signal.

17. The testing device of claim 11, wherein a frequency of the first testing signal and a frequency of the second testing signal is substantially the same.

18. The testing device of claim 11, wherein the first socket group is electrically coupled to a first termination line, the second socket group is electrically coupled to a second termination line, and the first termination line is different from the second termination line.

19. The testing device of claim 11, wherein the first socket group and the second socket group are electrically coupled to a same termination line.

20. The testing device of claim 11, wherein the first testing signal is received from the first I/O terminal through the first bus, the second testing signal is received from the second I/O terminal through the second bus, the first socket group is supplied with the doubled-frequency testing signal through the third bus, and the second socket group is supplied with the doubled-frequency testing signal through the fourth bus.

* * * * *